United States Patent [19]

Shreeve et al.

[11] Patent Number: 4,992,907
[45] Date of Patent: Feb. 12, 1991

[54] ELECTROSTATIC DISCHARGE PROTECTION SYSTEM

[75] Inventors: Robert W. Shreeve; John M. Herrmann, both of Corvallis, Oreg.

[73] Assignee: Hewlett-Packard Company, Palo Alto, Calif.

[21] Appl. No.: 351,355

[22] Filed: May 12, 1989

[51] Int. Cl.⁵ .................. H01L 23/60; H05F 3/02; H05F 3/04
[52] U.S. Cl. .................................. 361/220; 242/76; 226/168; 226/196
[58] Field of Search .................. 361/220–222, 361/214; 198/835; 439/13, 18, 23–29; 242/76; 226/168, 196

[56] References Cited

U.S. PATENT DOCUMENTS

| | | | |
|---|---|---|---|
| 3,140,621 | 7/1964 | Stone | 198/835 |
| 3,176,931 | 4/1965 | Hannay | 361/212 |
| 4,402,593 | 9/1983 | Bernard et al. | 361/221 |
| 4,814,698 | 3/1989 | St. Onge et al. | 361/212 |
| 4,831,488 | 5/1989 | Playe | 361/221 |

Primary Examiner—A. D. Pellinen
Assistant Examiner—Richard Elms

[57] ABSTRACT

An electrostatic discharge protection system for use in connection with a pulley or sprocket of the type having a central hub portion and opposite side portions. The hub portion is electrically non-conductive and is rotatably carried on a conductive shaft. The side portions are provided with conductive portions or members. A zener diode is connected between each conductive portion and the conductive shaft to enable electrostatic charges on each side of the pulley or sprocket to be safely drained off. Electrostatic charges present on strip material drawn over a pulley, sprocket or guide are also drained with the protection system. The system is also useful in connection with fixed guides which do not rotate.

18 Claims, 4 Drawing Sheets

ELECTROSTATIC DISCHARGE PROTECTION SYSTEM

FIELD OF THE INVENTION

This invention relates to techniques and systems for draining or discharging electrostatic charges from various devices Even more particularly, this invention relates to techniques and systems for discharging electrostatic charges from plastic strips carrying electronic devices (e.g., semiconductor devices) when such strips are passed over pulleys, sprockets or guides during normal handling and testing thereof.

BACKGROUND OF THE INVENTION

It is common in the electronic industry to secure various electronic components (e.g., semiconductor chips or devices) to flexible plastic strips or tape for handling and testing prior to eventual packaging of such components in the ultimate product (e.g., calculator or other product utilizing electronic components). For example, individual electronic components such as semiconductor chips or integrated circuit chips (sometimes referred to as dies) are commonly secured to lead frames comprising a plurality of conductive metal leads bonded to an insulating plastic substrate (such as polyimide).

The flexible plastic substrate is in strip form (sometimes referred to as a tape) and may vary in width from less than one inch to several inches wide depending upon both the size of the individual dies to be mounted and the desired size of the lead frame. The plastic strip may be many feet long, with many replications of the lead frames thereon.

Because the plastic strip is thin and quite flexible, it may be easily and conveniently wound upon reels for storage and handling For example, the strip is drawn off from a reel to enable the individual dies to be secured to successive lead frame patterns on the strip in accordance with known techniques. Then the strip is again wound onto a reel (normally with a plastic liner fed onto the reel also to prevent contact of the dies on the strip from the other adjacent layers of the strip).

In the processing and testing of the dies on the strip or tape, the tape normally must be passed over various idler pulleys, sprockets and guides in order to achieve proper movement, alignment, direction and tension on the tape. Unfortunately, as the tape passes over such pulleys an electrostatic charge can build up on the tape and pulleys, sprockets or guides. This is undesirable. If the electrostatic charge reaches too high a level it poses a serious risk to the dies which are mounted on the tape. In the event that the electrostatic charge on the tape, pulley, sprocket or guide reaches a level of about 100 volts there is the danger of the charge damaging or destroying one or more dies on the tape if the charge should be drained rapidly through the tape Although electrostatic charge build-up on the tape could be prevented by using electrically conductive pulleys, sprockets, and guides which are connected to ground, this would interfere or prevent testing of the electronic components (i.e., dies) mounted on the tape. The opposite edges of the tape may include special purpose voltage or ground rails. They must not be grounded or connected to each other because this would skew test results. In order for proper testing of the dies to be done, therefore, the opposite sides of the tape must be electrically isolated from each other. The presence of an electrically conductive pulley, sprocket or guide is inconsistent with the required electrical isolation. A directly grounded conductive pulley, sprocket, or guide might also cause the electrostatic charge to be discharged too rapidly, thereby causing damage to the die.

There has not heretofore been provided an electrostatic discharge protection system of the type described in connection with the present invention.

SUMMARY OF THE PRESENT INVENTION

In accordance with the present invention there is provided an electrostatic discharge protection system for use in connection with a pulley or sprocket of the type having a central hub portion and opposite side portions The hub portion is electrically non-conductive and is rotatably carried on a conductive shaft. Each of the side portions is provided with a conductive portion or strip which preferably encircles the side portion (i.e., preferably it extends around the circumference of the pulley).

The conductive portion at each side of the pulley is connected to the conductive shaft (i.e., to a ground) through a zener diode. Preferably each conductive portion is connected to separate zener diodes. The two diodes are in turn each connected to a third zener diode which is then connected to ground (e.g., to the conductive shaft on which the pulley or sprocket is rotatably carried).

The zener diodes are preferably selected such that they exhibit a breakdown voltage lower than that at which damage would occur to the die, but higher than the voltage which would be applied to the die during testing.

This system prevents build-up of high levels of electrostatic charges on the pulley and on the plastic tape which is passed over the pulley. Accordingly, the danger of undesirable electrostatic discharge through dies carried on the tape is avoided. This prevents electrical damage to or destruction of dies on the tape, and does not interfere with testing.

The protection system of the invention is preferably used in connection with each pulley, sprocket or guide over which the elongated tape is passed in order to prevent build-up of undesirable levels of electrostatic charges. The protection system also does not interfere with proper electrical testing of dies mounted on the tape.

BRIEF DESCRIPTION OF THE DRAWINGS

The invention is described in more detail hereinafter with reference to the accompanying drawings, wherein like reference characters refer to the same pats throughout the several views in which.

DETAILED DESCRIPTION OF THE INVENTION

Figure 1:
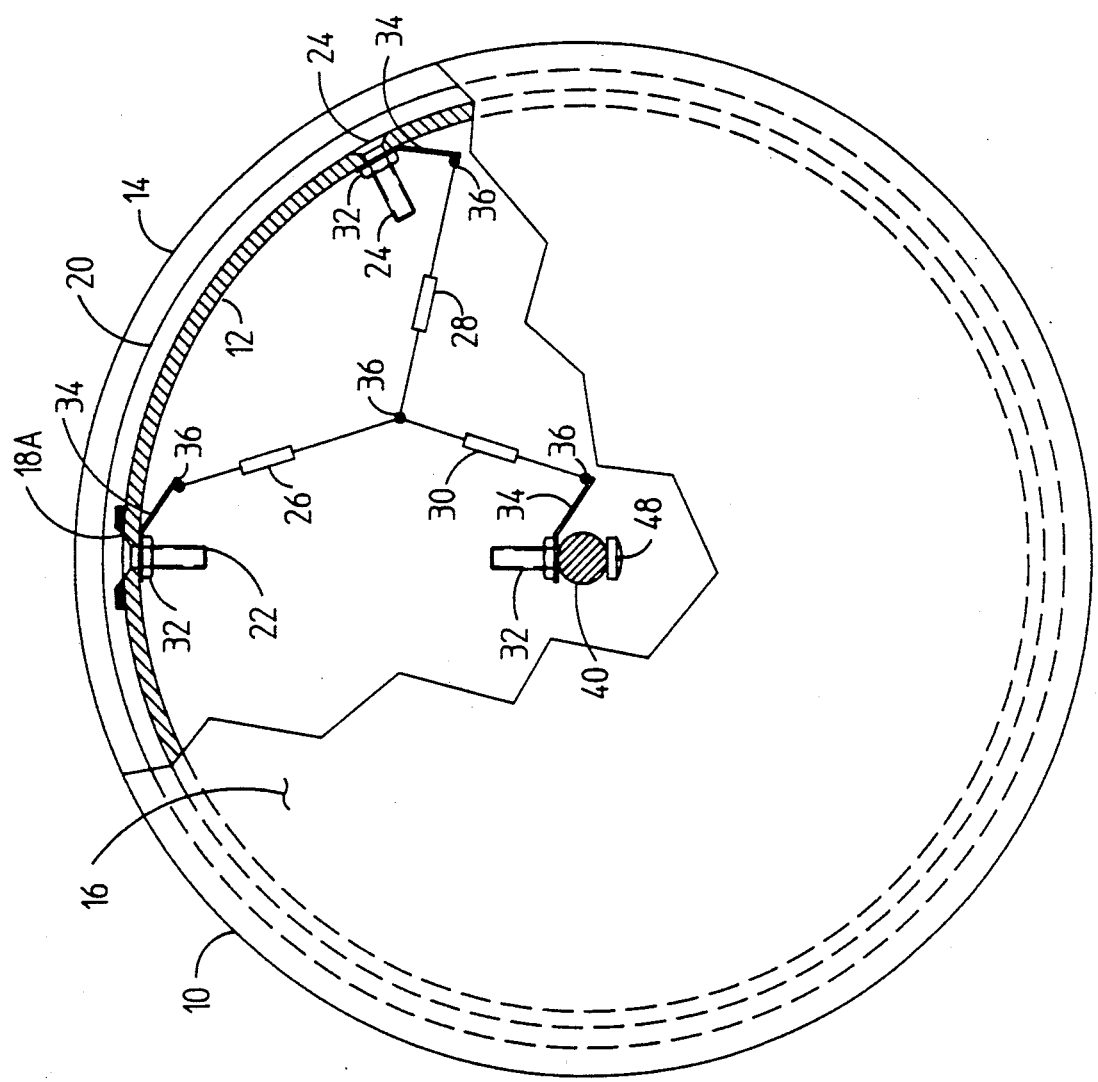
FIG. 1 is a side elevational view of a pulley or sprocket which includes the protection system of the invention.
Figure 2:
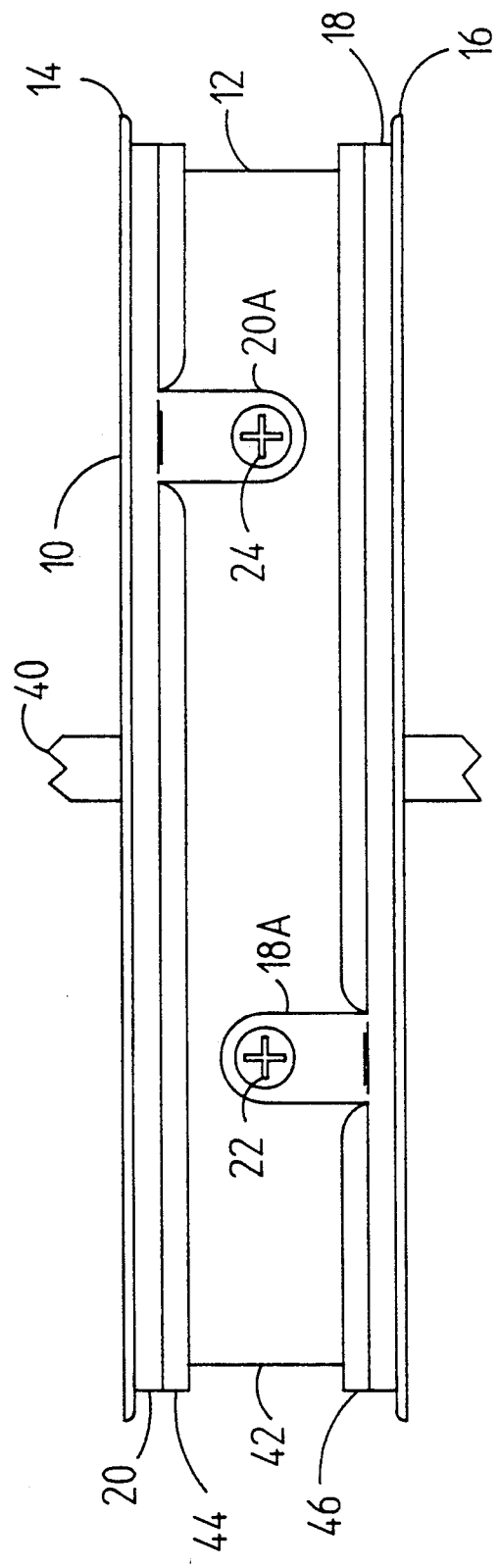
FIG. 2 is a top view of the pulley or sprocket shown in FIG. 1.

In the drawings there is illustrated a preferred protection system of the invention. Pulley or sprocket 10 includes a central rim or hub portion 12 and opposing side portions 14 and 16 which are electrically non-conductive. The pulley or sprocket is adapted to be rotatably supported on a conductive shaft 40, as illustrated.

The rim 12 includes a central portion 42 and two outer portions 44 and 46. The central portion 42 is lower than the outer portions 44 and 46 to provide clearance and mechanical separation from the dies which are carried along the centerline of the plastic tape.

A conductive strip (conductive metal layer) 18 encircles the raised portion 46 and includes tab member 18A. Similarly, a conductive strip 20 encircles raised portion 44 and includes tab member 20A. A threaded metal screw 24 passes through tab 20A and central portion 42. A solder tab 34 is attached to the screw 24 at the inner surface of the central portion 42 by threaded nut 32. The screw 24 provides electrical contact between the tab 20A and the solder tab 34, as well as providing mechanical support for solder tab 34.

Similarly, a threaded screw 22 passes through tab 18A and a second solder tab 34 and is held in place by a second nut 32.

The wire lead of a zener diode 26 is electrically connected to solder tab 34 on screw 22 (and thus to conductive strip 18) by a solder joint 36. Also, the wire lead of a second zener diode 28 is connected to solder tab 34 on screw 24 (and thus to conductive strip 20) by a second solder joint 36. The opposite wire leads of zener diodes 26 and 28 are electrically connected to a wire lead of a third zener diode 30 by a third solder joint 36. The opposite wire lead of zener diode 30 is electrically connected to a third solder tab 34, which is electrically and mechanically connected to the conductive shaft 40 by a screw 48 and nut 32 and a fourth solder joint 36.

The reference herein to pulley also includes reference to a sprocket. For purposes of this invention, the protection system is equally applicable and effective for both pulleys and sprockets.

Electrostatic charges on each side of the pulley or sprocket or on tape drawn over the pulley or sprocket are safely drawn off by the protection system shown. The zener diodes are selected, as desired, to enable electrostatic charges which exceed predetermined levels to be drained off safely.

Figure 3:
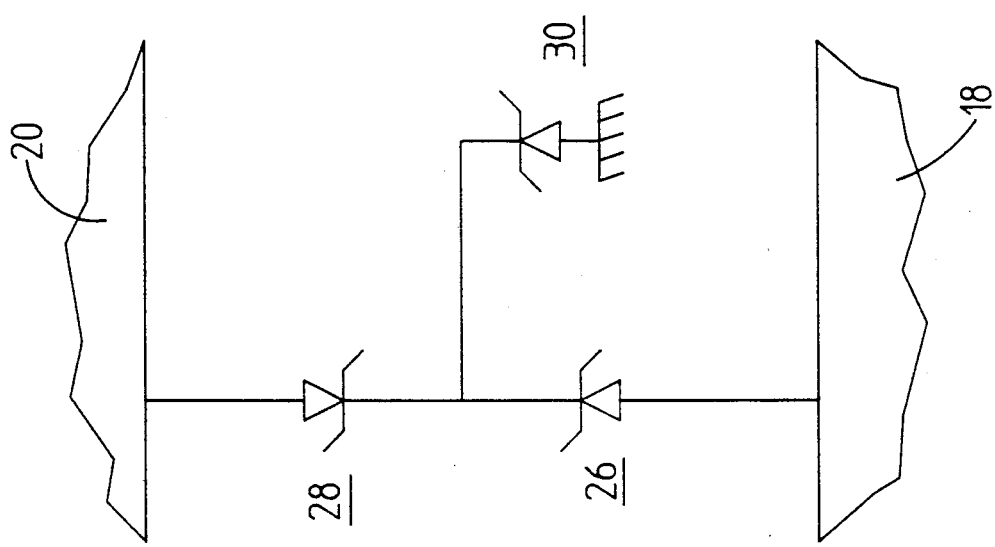
FIG. 3 is a schematic diagram illustrating use of the protection circuit of the invention.
Figure 4:
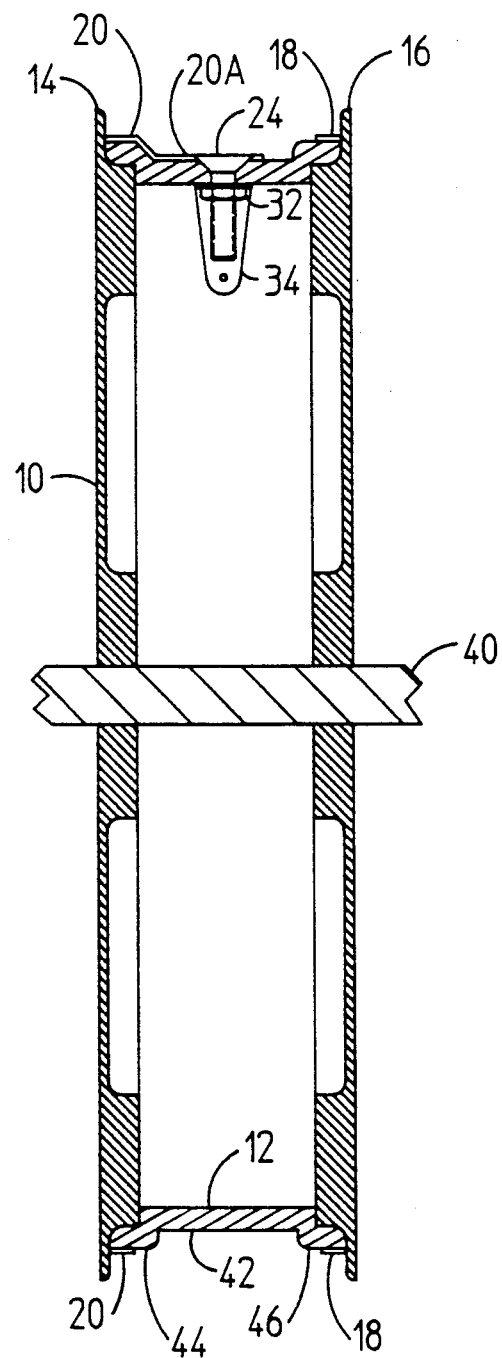
FIG. 4 is a cross-sectional view of the pulley of sprocket including the protection system shown in FIGS. 1 and 2.

This is further illustrated in FIG. 3. With this preferred system, the protection system enables safe discharge to ground of electrostatic charges present on the sides of the pulley or sprocket. The zener diodes may be selected so as to provide for draining of electrostatic charges which are above a predetermined level.

Also, a higher degree of static charging on one side of the pulley than the other will be eliminated by draining the charge through a respective zener diode. This will assure that one side of the pulley does not become too highly charged relative to the opposite side. Otherwise, there is a possibility of undesirable discharge from one side of the pulley to the other through or across the tape passing over the pulley. This could result in damage to dies mounted on the tape.

The operation of the circuit shown in FIG. 3 is illustrated and explained as follows. When a voltage of either polarity is applied between conductive strip 20 and ground, one of the diodes 28 and 30 will be forward biased (and thus conductive) and the other diodes will be reverse biased. So long as the voltage is less than the zener breakdown voltage no current will flow (because the reverse biased diode will not conduct) When the applied voltage rises to the zener breakdown point (Vz), the reverse biased diode will conduct. The other diode is also conducting because it is still forward biased, so the two diodes in series will be conductive.

Switching the polarity of the applied voltage will simply change the roles of the two diodes, i.e., the one diode which was reverse biased will be forward biased, and vice-versa. The net effect will be he same (i.e., a forward biased diode in series with a reverse biased diode, both of which will conduct when the voltage rises above Vz).

The effect of having the diodes in series is that the electrostatic charge on strip 20 can never go higher than $+Vz$ above ground or lower than $-Vz$ below ground. Similarly, the charge on strip 18 can never go outside the limits of $+Vz$ to $-Vz$ (with respect to ground), nor can it go outside of $+Vz$ to $-Vz$ with respect to strip 20.

Typically, electrostatic charges as low as 100 volts can cause serious damages to dies mounted on the plastic tape. Thus, the zener diodes used on pulleys or sprockets over which such types of tapes are passed should exhibit breakdown voltages well below that level.

The protection system of the invention is useful in preventing undesirable electrostatic discharge through the dies on the tape by draining the electrostatic charges on both sides of the pulley or sprocket and by preventing the charge on one side from building to a high level relative to the opposite side of the pulley or sprocket The protection system also exhibits low leakage currents and yet provides fast switching times to effectively control electrostatic charge build-up on the pulleys, sprockets or guides. Further, the protection system does not interfere with normal functional, parametric, and leakage tests performed on the electronic devices on the tape.

Other advantages will be apparent without departing from the scope of the present invention. For example, in another variation the pulley or sprocket could rotate freely on the conductive shaft. In such event the connection between the zener diodes and the shaft can be made or effected by means of a slip-ring connection or other rotatable electrical coupling.

In yet another variation the shaft may be non-conductive. In such embodiment grounding is effected by a slip-ring elsewhere on the shaft which is connected to the diodes by a wire (or other conductor) which is carried on the surface of the shaft or through an axial bore inside the shaft.

In another embodiment the two conductive strips on the sides of the pulley or sprocket are connected to the shaft with a current-limiting resistor(s) instead of using zener diodes. Such a protection system would not be useful when testing the dies on the tape, however, because the resistor(s) to ground might affect the test results The system, however, could be used for other manufacturing steps.

Another variation involves connecting the two conductive rings or strips 18 and 20 together with a conductive wire. The wire is then connected to ground through a pair of zener diodes. This variation is not suitable when testing the dies on the tape but it could be used in other manufacturing operations This same technique could be used by substituting the two conductive strips with a single conductive strip.

In still another variation, the protection system of the invention may be used in connection with fixed guides (i.e., guides which do not rotate about a shaft). This variation is considered to be equivalent to the system illustrated for use on rotating pulleys or sprockets.

What is claimed is:

1. An electrostatic discharge protection system for use in connection with a pulley or sprocket of the type rotatably carried on a conductive shaft and having a central hub portion and first and second side portions on opposite sides of said hub portion; wherein said hub portion is electrically non-conductive; and wherein each said side portion includes a conductive portion; wherein each said conductive portion is electrically connected to said shaft through a zener diode.

2. A system in accordance with claim 1, wherein each said zener diode has a breakdown voltage not exceeding 30 volts.

3. A system in accordance with claim 1, wherein each said side portion is connected to a separate zener diode.

4. A system in accordance with claim 1, wherein there are first, second and third zener diodes; wherein said conductive portion on one of said side portions is electrically connected to said first zener diode, wherein said conductive portion on the other of said side portions is connected to said second zener diode; and wherein said third zener diode is connected between said first and second zener diodes and said shaft.

5. An electrostatic discharge protection system for use in connection with a pulley or sprocket of the type having a central hub portion and first and second side portions carried on opposite sides of said hub portion; wherein said hub portion is electrically non-conductive and is rotatably carried on a conductive shaft; wherein each said side portion includes a conductive portion extending therearound; wherein each said conductive portion is electrically connected to said shaft through a zener diode.

6. A system in accordance with claim 5, wherein each said zener diode has a breakdown voltage not exceeding 30 volts.

7. A system in accordance with claim 5, wherein each said side portion is connected to a separate zener diode.

8. A system in accordance with claim 5, wherein there are first, second and third zener diodes; wherein one of said side portions is electrically connected to said first zener diode, wherein the other of said side portions is connected to said second zener diode; and wherein said third zener diode is connected between said first and second zener diodes and said shaft.

9. A system in accordance with claim 5, wherein said conductive portion on each said side portion comprises a continuous conductive strip which encircles said side portion.

10. A system in accordance with claim 8, wherein each said zener diode has a breakdown voltage not exceeding 30 volts.

11. A method for preventing build-up of electrostatic charge on a pulley or sprocket of the type rotatably carried on a conductive shaft and having a central hub portion and first and second side portions can opposite sides of each hub portion; wherein said hub portion is non-conductive; and wherein said method comprises the steps of:
(a) extending a conductive portion around each said side portion of said pulley;
(b) providing first, second and third zener diodes;
(c) connecting said conductive portion on said first side portion to said first zener diode;
(d) connecting said conductive portion on said second side portion to said second zener diode;
(e) connecting said first and second zener diodes together;
(f) connecting said first and second zener diodes to said third zener diode; and
(g) connecting said third zener diode to said conductive shaft.

12. A method in accordance with claim 11, wherein said each conductive portion comprises a continuous conductive strip which encircles a said side portion.

13. A method in accordance with claim 11, wherein each said zener diode has a breakdown voltage not exceeding 30 volts.

14. An electrostatic discharge protection system for use in connection with a guide having a central rim portion and first and second side portions on opposite sides of said rim portion; wherein said rim portion is electrically non-conductive; and wherein each side portion includes a conductive portion which is electrically connected to ground through a zener diode.

15. A system in accordance with claim 14, wherein there are first, second and third zener diodes; wherein said conductive portion on one of said side portions is electrically connected to said first zener diode, wherein said conductive portion on the other of said side portions is connected to said second zener diode; and wherein said third zener diode is connected between said first and second zener diodes and ground.

16. A system in accordance with claim 15, wherein each said zener diode has a breakdown voltage not exceeding 30 volts.

17. An electrostatic discharge protection system for use in connection with a pulley of the type rotatably carried on a conductive shaft and having a central hub portion and first and second side portions on opposite sides of said hub portion; wherein said hub portion is electrically non-conductive; and wherein each said side portion includes a conductive portion; wherein each said conductive portion is electrically connected to said shaft through a current limiting resistor.

18. A system in accordance with claim 1, wherein said conductive portions of said side portions are electrically connected together and are connected to ground through two zener diodes connected in series.

* * * * *